United States Patent [19]

Olmstead

[11] 4,400,653
[45] Aug. 23, 1983

[54] RESONANT SCAN DEFLECTION CIRCUIT WITH FLYBACK VOLTAGE LIMITING

[75] Inventor: H. Wayne Olmstead, Hillsboro, Oreg.

[73] Assignee: Tektronix, Inc., Beaverton, Oreg.

[21] Appl. No.: 361,177

[22] Filed: Mar. 24, 1982

[51] Int. Cl.³ .................. H01J 29/70; H01J 29/76
[52] U.S. Cl. ............................ 315/408; 315/387; 358/243
[58] Field of Search .......... 315/411, 387, 388, 408; 358/220, 243

[56] References Cited

U.S. PATENT DOCUMENTS 4,058,754 11/1977 Ohnishi et al. .............. 358/243
4,082,986 4/1978 Gamboa ...................... 358/243

Primary Examiner—Theodore M. Blum
Attorney, Agent, or Firm—John Smith-Hill; John D. Winkelman

[57] ABSTRACT

This invention is designed to protect a resonant scan deflection transistor in a deflection circuit from extremely high flyback voltage pulses. The deflection transistor is protected against high flyback voltage pulses even though: the B+ voltage on the deflection circuit varies over a wide range, the rate of the base drive signal varies over a wide range, and the turn-off delay time of the deflection transistor varies from device to device and for any one device as the base drive signal rate changes. The circuit of this invention compensates for the variations in turn-off delay time ($t_D$) of the deflection transistor at different horizontal scanning rates, and, in response to this compensation, compares the B+ voltage level with the current in the deflection coil. An extra turn-off trigger signal is developed in response thereto for energizing the deflection transistor drive circuit. In response to the trigger signal, the deflection transistor turns off. Since the extra trigger signal (if needed) is received before the sync pulse is received, the deflection transistor turns off and is thereby protected against a dangerously large flyback voltage pulse.

4 Claims, 4 Drawing Figures

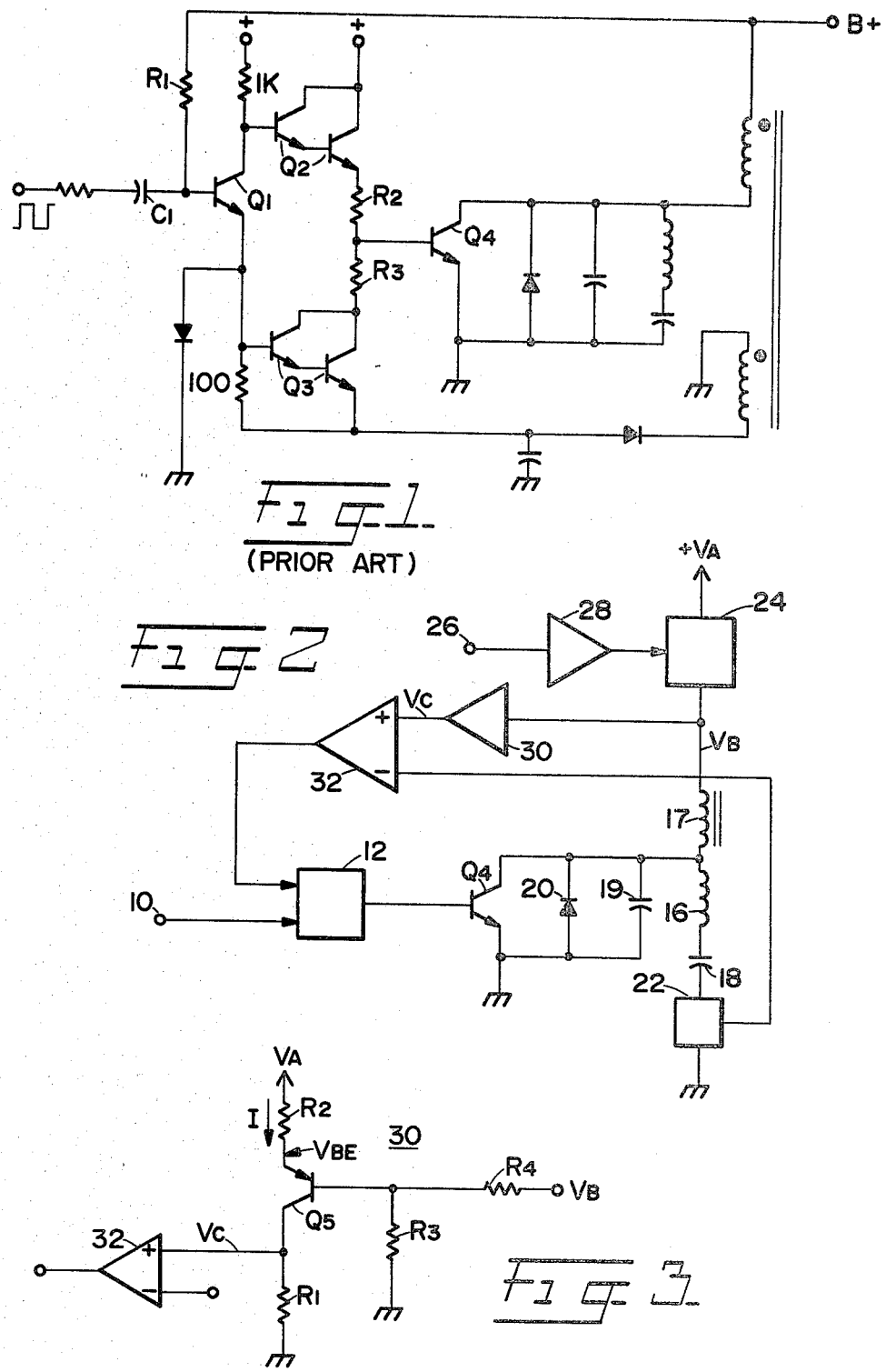

RESONANT SCAN DEFLECTION CIRCUIT WITH FLYBACK VOLTAGE LIMITING

BACKGROUND OF THE INVENTION

1. Field of the Invention

This invention pertains to resonant scan (flyback) deflection circuits and, more specifically, to means for protecting the output transistor in such a circuit from being damaged by excessive flyback voltage.

2. Description of the Prior Art

Horizontal deflection circuits for television receivers, picture monitors, computer terminal displays, etc., typically use a resonant scan (flyback) technique to create the horizontal deflection ramp signal. Such devices are designed to operate in various different formats in terms of scan rates, number of scanning lines, scan size, etc., depending on the particular display application or television standard for which they are designed. It is of course desirable to provide a single, versatile deflection circuit that can be used for any display format without the need to modify or recalibrate the circuit. However, such a wide range, variable rate resonant scan deflection circuit requires a B+ voltage source with an equally wide range. This subjects the horizontal output transistor to the risk of destruction from extremely large flyback voltage peaks produced, for example, during instrument turn-on or by free run transients. Other resonant scan deflection circuit failure modes, and prior art means for protecting the horizontal output transistor, are outlined in the background section of U.S. Pat. No. 4,241,296 to Barter, issued Dec. 23, 1980 and assigned to the assignee of the present invention.

The above-mentioned Barter patent discloses a horizontal deflection output circuit capable of operating at different scan rates, while at the same time protecting the horizontal output transistor from being damaged or destroyed by excessively high flyback voltage pulses. A pertinent portion of the Barter circuit is shown in FIG. 1. During flyback, the deflection yoke current causes a very high voltage (e.g., about 1200 V). to build up on the flyback capacitor connected across the output transistor's collector and emitter terminals. If the yoke current becomes too large before flyback occurs, the voltage across the output transistor ($Q_4$) will exceed the device's maximum allowable $V_{CE}$ and destroy it. The output transistor is protected by a one-shot multivibrator comprised of transistor $Q_1$, resistor $R_1$ and capacitor $C_1$. Capacitor $C_1$ charges during the negative portion of the horizontal drive pulse applied to the input resistor $R_0$. If the positive-going edge of the drive pulse does not occur before capacitor $C_1$ charges to the voltage required to turn $Q_1$ on, the voltage on capacitor $C_1$ will turn on transistor $Q_1$ and terminate the trace by turning off horizontal output transistor $Q_4$ via Darlington transistors $Q_2$ and $Q_3$ and resistors $R_2$ and $R_3$. With increasing B+ voltage, capacitor $C_1$ will charge faster and turn on $Q_1$ sooner if the positive-going drive pulse edge does not occur in time.

The FIG. 1 drive circuit has relatively low gain, so it is designed to begin turning $Q_1$ on relatively early, insuring that the output transistor will be switched off so that the flyback voltage will not be excessively high. However, this produces "jitter" in the deflection circuit, a condition in which the leading edge of the flyback pulse is time variant in a vibratory or random manner. In addition, the FIG. 1 circuit does not compensate for changes in the storage delay (i.e., turn-off delay time) of the deflection transistor at different scanning rates. The flyback voltage limit imposed by the circuit thus varies with the scanning rate, rather than remaining constant, and makes it necessary to establish on overly large "buffer zone" between the maximum permissible flyback voltage and the circuit-imposed limit.

SUMMARY AND OBJECTS OF THE INVENTION

A general object of the present invention is to provide a resonant scan deflection circuit incorporating improved flyback voltage limiting.

A related object of the invention is to provide a flyback-type deflection circuit in which the flyback voltage is automatically limited to prevent damage to the deflection coil driver.

Another object of the invention is to provide a deflection circuit that incorporates protection circuitry for a bipolar device used to drive a deflection coil.

A further object is to provide protection circuitry that compensates for changing storage delays of the deflection coil driver transistor at different deflection rates.

Still a further object is to provide a flyback-type deflection circuit in which the flyback voltage is limited to approximately the same value over a wide range of scanning rates.

These and other objects of the present invention are accomplished with the present invention. The new flyback voltage limit circuit is transparent to the deflection drive circuit, except when it is actually protecting the deflection transistor. Hence, in normal operation, the flyback voltage limit circuit adds no jitter. Also, due to the relationship between the voltages $V_C$ and $V_B$ (see FIG. 3) and by carefully selecting the values of $R_1$, $R_2$, $R_3$ and $R_4$, the variable storage delays of the deflection transistor (i.e., variations in the turn-off delay time) at different rates can be taken into account, such that the flyback voltage limit will be approximately the same at all rates. Further, due to the fact that the turn-off delay time of the deflection transistor has been taken into account, the deflection circuit of the present invention can protect the deflection transistor from excessive flyback voltages by monitoring the B+ voltage level and the peak current in the deflection coil, and developing an extra turn-off trigger signal in response thereto, the trigger signal turning off the deflection transistor before the current in the deflection coil reaches an unsafe level, that is, a level which would produce a dangerously large flyback voltage pulse potentially harming the deflection transistor had the deflection transistor been turned-off under normal conditions (utilizing the sync pulse). The careful selection of the values for $R_1$, $R_2$, $R_3$ and $R_4$ ensures that the trigger signal is generated in time to turn-off the deflection transistor such that a dangerously large flyback voltage pulse will not be produced.

Further scope of the applicability of the present invention will become apparent from the description given hereinafter. However, it should be understood that the details of the description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 illustrates a deflection circuit used in the prior art;

FIG. 2 is a simplified circuit schematic illustrating the principle of operation of the present invention;

FIG. 3 is a circuit schematic of the one circuit block in FIG. 1; and

DETAILED DESCRIPTION OF THE INVENTION

Figure 4:
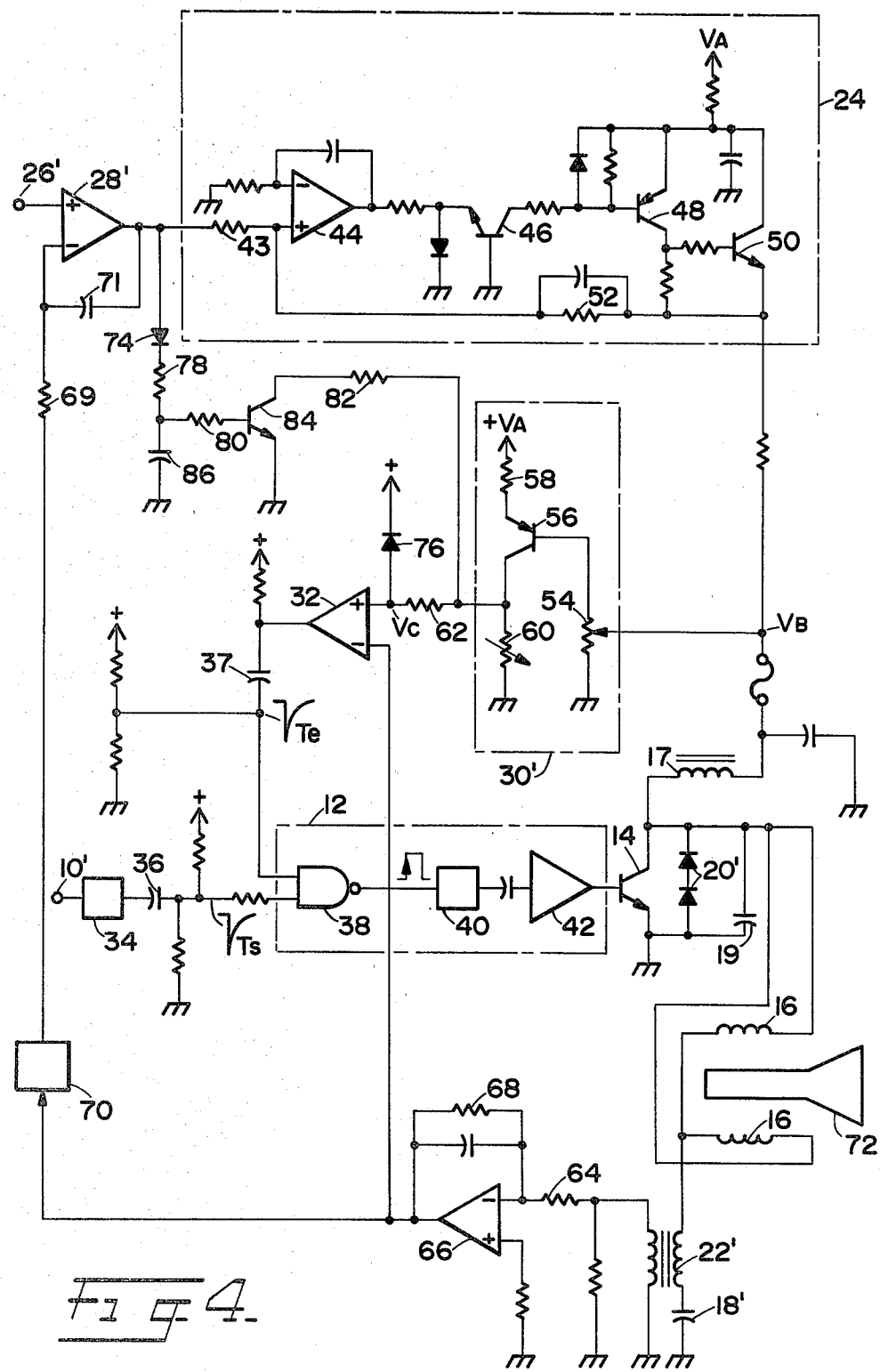
FIG. 4 is a circuit diagram illustrating one embodiment of the deflection circuit according to the present invention.

FIG. 2 illustrates the principle of operation of this invention. Deflection coil driving bipolar transistor $Q_4$ is controlled by the output signal from deflection transistor driving circuit 12 which is, in turn, controlled by a sync pulse via input terminal 10. The primary current path of transistor $Q_4$ is connected in parallel with deflection coil 16. Capacitor 18 is connected in series with the deflection coil 16. Damping diode 20 is connected across the collector-emitter terminals of transistor $Q_4$. Flyback capacitor 19 is connected in parallel with the deflection coil 16 and diode 20. Scan voltage control circuit 24 supplies a controllable driving voltage $V_B$ to the resonant deflection circuit under control of a control signal applied to control circuit 24 via control terminal 26 and amplifier 28. The control signal is modified for providing necessary adjustment and correction so that optimum deflection is performed under different conditions. Current sensing means 22, which may be a transformer or a resistor, is connected in series with deflection coil 16 for detecting the deflection current in deflection coil 16. The sensed signal is converted to a voltage, and this voltage is compared by comparator 32 with a voltage $V_C$. The controllable supply voltage $V_B$ is attenuated and shifted in an amplifier 30 to produce the voltage $V_C$. The output signal of the comparator 32 is supplied to control circuit 12.

In operation, the general purpose or objective of the deflection circuit is to build a sawtooth or ramp current in deflection coil 16. Assume that capacitor 18 is initially charged to the supply voltage $V_B$ while transistor $Q_4$ is non-conducting. When transistor $Q_4$ turns on, the charge in capacitor 18 is discharged through deflection coil 16. Then when transistor $Q_4$ turns off, the current that continues to flow through coil 16 charges the flyback capacitor 19. When capacitor 19 is fully charged, the flyback capacitor 19 begins charging the capacitor 18. This happens because, when the voltage across the flyback capacitor 19 tries to go negative, damper diode 20 becomes conductive allowing the flow of deflection current through the coil 16, through diode 20, to charge capacitor 18. When capacitor 18 is fully charged, deflection transistor $Q_4$ is turned on by the driving signal from driving circuit 12. The energy stored in capacitor 18 is again released through the primary current path of transistor $Q_4$. The net result is a ramp signal current flowing in deflection coil 16 to deflect the electron beam on the face of a CRT (not shown in FIG. 2).

The slope of the ramp waveform in coil 16 representative of the deflection current depends on the control signal applied to control terminal 26 and ultimately the driving voltage $V_B$ supplied to deflection coil 16. When transistor $Q_4$ turns-off, a large flyback voltage pulse occurs across flyback capacitor 19 since residual energy still flows out of coil 16 and charges capacitor 19. The flyback voltage pulse depends on the current in coil 16 at the time transistor $Q_4$ turns off. The current in coil 16 depends on the voltage $V_B$ and the turn-off delay time ($t_D$) of transistor $Q_4$. The turn-off delay time varies from transistor to transistor (because of beta and other device parameters); $t_D$ also varies in response to a change in scan rate. At higher scan rates, e.g. 25 kHz or higher, $t_D$ will go down because the base drive current is not fully established before turn-off begins.

The circuit of FIG. 1 monitored the slope of the ramp waveform, since as $V_{B+}$ increased, the transistor turned on sooner than if $V_{B+}$ had not increased. However, this invention goes one step further: it, too, monitors the slope of the ramp waveform by monitoring the voltage level $V_B$. However, it also monitors the peak current in deflection coil 16. The invention will provide an extra turn-off trigger signal, if needed, to deflection transistor drive circuit 12. The need for such a trigger signal is dictated by the voltage level $V_{B+}$ and the current in the deflection coil. Transistor $Q_4$ will turn off sooner in time if the trigger signal is received by the driving circuit 12 before the sync pulse is received. Therefore, the transistor $Q_4$ will be turned-off in time to prevent the voltage across the flyback capacitor 19 from being excessively large. Comparator 32 compares a sample of the deflection coil current with a DC voltage $V_C$. The voltage $V_C$ is derived from the supply voltage $V_B$. The comparator determines if and when the extra turn-off pulse occurs. The sample of the deflection coil current is sensed by the sensing circuit 22, which may be a transformer or a current sensing resistor connected in series with deflection coil 16. Referring to FIG. 3, the DC voltage $V_C$ is developed by an amplifier 30 which further includes transistor $Q_5$ and resistors $R_1$, $R_2$, $R_3$, and $R_4$. Voltage $V_C$ can be given by the following expression:

$$V_C = R_1/R_2(V_A - (R_3/R_3 + R_4)V_B - V_{BE}) \tag{1}$$

If $V_B$ increases, capacitor 18 charges to a higher level, i.e., the new level of $V_B$. Therefore, the ramp waveform representative of the current passing through coil 16 and through the collector-emitter circuit of transistor $Q_4$ has an increased slope. As $V_B$ increases, voltage $V_C$, appearing at the positive input terminal of comparator 32, decreases. When the current passing through the current sensing means 22 is increasing, the voltage appearing at the negative input terminal of the comparator 32 is increasingly more positive. When the voltage at the negative input terminal of the comparator 32 becomes equal to the voltage $V_C$, a negative-going spike is produced at the output terminal of comparator 32 which is the trigger signal needed to ultimately turn-off transistor $Q_4$. It is noted that, since $V_C$ decreased in magnitude, the trigger signal is produced by the comparator 32 sooner in time. Consequently, the deflection driving transistor $Q_4$ is effectively protected from excessive flyback voltage pulses by anticipating the possible magnitude of deflection coil current and turning off transistor $Q_4$ before the current can become so great that an excessive flyback voltage pulse will be produced which can harm the driving transistor $Q_4$. However, when the circuit operates properly, the extra trigger pulse occurs later in time when the sync pulse and is transparent to, and therefore does not affect, the circuit operation because deflection transistor driving circuit 12 is driven only by the sync pulse applied to sync input terminal 10 and not by the trigger pulse. Therefore, since the trigger pulse is transparent to the circuit operation, when the circuit is operating properly, no jitter is caused to occur in the scanning operation of the deflection circuit.

The extra protection trigger may be NANDed with the sync pulse to produce a trigger pulse for deflection transistor driving circuit 12. Since the protection trigger will always be present even if it is not needed (e.g., it may follow the normal sync pulse in time), drive circuit 12 may ignore it by simply using a non-retriggerable one-shot multivibrator for setting the amount of time that deflection transistor $Q_4$ will be off.

Furthermore, the equation (1) for $V_C$ is such that $R_1$ through $R_4$ can be chosen so that the changes in storage delay, i.e., turn-off delay time ($t_D$) of deflection transistor $Q_4$ at the higher scan rates can be taken into account. This may be fully understood by the description of the practical circuit shown in FIG. 4 given hereinafter.

As set forth hereinabove, this invention takes into account the changes in storage delay ($t_D$) of the deflection transistor $Q_4$ from one transistor to another, and for delay changes in any given transistor that results from operation at the higher scan rates, by selecting carefully the values of resistors $R_1$, $R_2$, $R_3$, and $R_4$. The storage delay ($t_D$), i.e., the turn-off delay time of the transistor $Q_4$, must be taken into account, and therefore, the values of resistors $R_1$, $R_2$, $R_3$, and $R_4$ must be carefully selected, in order to produce the trigger signal on the output of the comparator when required for protecting the deflection transistor $Q_4$ from the excessive flyback voltages. It is therefore very important that the values of these resistors be selected carefully in order to successively achieve one of the major objects of this invention. The following is a sample calculation for selecting the values of $R_1$, $R_2$, $R_3$, and $R_4$:

Given:
 deflection coil current needed for maximum size scan = 6 amperes peak-to-peak
 $V_A$ = 185 volts
 $t_D$ at lowest rate (57 μS active time) = 9 μS
 $t_D$ at highest rate (20 μS active time) = 8 μS
 $V_B$ at lowest rate = 50 volts
 $V_B$ at highest rate = 175 volts
 deflection coil current sample voltage = 2 volt/amp
 voltage limit = 1400 volts
 3.5 amperes in deflection coil 16 when transistor 14 turns off produces a 1400 volt flyback pulse at the highest rate and a 1275 volt flyback pulse at the lowest rate Then:
 The slope of deflection coil current at the lowest rate is approximately:

$$6 \text{ amps}/57 \text{ μS} \times 2 \text{ volt/amp} = 0.21 \text{ volt/μS} \quad (2)$$

The slope of delfection coil current at the highest rate is approximately:

$$6 \text{ amp}/20 \text{ μS} \times 2 \text{ volt/amp} = 0.60 \text{ volt/μS} \quad (3)$$

The transistor $Q_4$ turn off by the time the deflection coil current sample voltage reaches:

$$3.5 \text{ amp} \times 2 \text{ volt/amp} = 7 \text{ volts} \quad (4)$$

$V_C$ for the low rate needs to be:

$$7 \text{ volts} - 0.21 \text{ volt/μS} \times 9 \text{ μS} = 5.11 \text{ volts} \quad (5)$$

$$7 \text{ volts} - 0.60 \text{ volts/μS} \times 8 \text{ μS} = 2.2 \text{ volts} \quad (6)$$

Let:

$$X = (R_3/R_3 + R_4) \text{ and } Y = R_1/R_2$$

The expressions (1), (5) and (6) set up the following two equations to solve for X and Y Lowest rate: $5.11 = 184.3Y - 50XY$ (7)

Highest rate: $2.2 = 184.3Y - 175XY$ (8)

The solutions for X and Y are:

$X = 0.684$ $Y = 0.034$

It can be seen from the foregoing that $R_1$ or $R_2$ and $R_3$ or $R_4$ can be chosen arbitrarily:

let $R_2 = 191$ KΩ and $R_4 = 60$ KΩ

Then $R_1 = 6.49$ KΩ and $R_3 = 129.9$ KΩ

This means that the current in deflection coil 16 will never exceed 3.5 amperes and, hence, the flyback voltage pulses will not exceed 1400 volts, which is the safe withstand voltage for deflection transistor $Q_4$.

One preferred practical embodiment of this invention is shown in the electrical circuit of FIG. 4. A sync pulse signal to sync terminal 10' is fed to deflection transistor driving circuit 12 via logic means 34, such as a flip-flop, and differentiation capacitor 36 for providing a negative trigger pulse Ts on the negative edge of the output from logic means 34. The output from comparator 32 is also coupled to driving circuit 12 via capacitor 37 to provide an extra trigger pulse Te. Driving circuit 12 may consist of NAND gate 38, non-retriggerable one-shot multivibrator 40 and driving amplifier 42. NAND gate 38 receives the two trigger pulses Ts and Te to trigger multivibrator 40. Either one of the two pulses, whichever occurred first, will trigger it. However, as mentioned hereinbefore, the sync trigger pulse Ts normally triggers it and the extra trigger te is effective only in abnormalities when dangerously large flyback voltage pulses may be developed. The driving amplifier 42 drives deflection transistor 14 to turn it off when the trigger pulse Ts or Te is received.

The correction and size signal applied to terminal 26' is fed to scan supply voltage control circuit 24 via amplifier 28'. Control circuit 24 inverts and amplifies the voltage source $V_A$ to provide the deflection voltage $V_B$ ($V_A$ is normally negative). Voltage control circuit 24 includes operational amplifier 44, common base transistor 46, output transistors 48, 50, input resistor 43 and feedback resistor 52. The primary function of voltage amplifier circuit 24 is to provide the voltage $V_B$ to drive deflection coil 16 so that appropriate deflection current for a desired scan rate, including corrections for pincushion distortion, is developed in deflection coil 16.

The driving supply voltage $V_B$ is then applied to inverting amplifier circuit 30' to develop a voltage $V_C$ related to $V_B$. Amplifier circuit 30' includes potentiometer 54, transistor 56, and emitter and collector resistors 58 and 60. A voltage $V_C$ related to $V_B$ and given by expression (1) is applied to the non-inverting input of comparator 32 via resistor 62. The deflection current sensed by sensing transformer 22' is applied via resistor 64 to operational amplifier 66 including feedback resistor 68. The output voltage proportional to the sensed current is applied to the inverting input of comparator 32. Therefore, comparator 32 provides a negative going pulse whenever the combination of a deflection current increase and the voltage $V_C$ indicates that a trigger pulse is needed to turn-off the deflection transistor 14 before a dangerous flyback voltage pulse harms the transistor.

The output voltage from amplifier 66 may be applied via circuit means 70 to amplifier 28' to complete the closed loop. Circuit means 70 may be a sample and hold circuit which provides a signal which represents the peak current in the deflection coil. This signal is compared to signal 26 which represents the desired peak deflection current. Resistor 69 and capacitor 71 provide compensation for the entire closed loop.

An additional protection circuit including diodes 74 and 76, resistors 78, 80 and 82, transistor 84 and capacitor 86 is provided to control the voltage Vc on the non-inverting input terminal of comparator 32 when the output from amplifier 28' exceeds a certain level. Resistor 82 is placed in parallel with resistor 60, thus reducing the collector voltage of transistor 56, when transistor 84 becomes conductive, thereby providing the extra trigger pulse Te sooner than normal to turn transistor 14 off. Resistor 62 and diode 76 protect comparator 32 from excess voltage if transistor 56 breaks down.

As is understood from the foregoing description, the deflection circuit according to this invention can provide a very reliable automatic protection of deflection driving transistor 14 from dangerously high flyback voltage by taking into account the turn-off delay time of transistor 14 and the slope of the deflection current. An extra trigger pulse can be generated if needed to turn off the deflection transistor 14. When the extra trigger pulse is received by circuit 12 before the sync pulse from terminal 10 is received, the extra trigger pulse turns off the transistor 14. It does not affect the circuit operation under the normal operation of the circuit, that is, when $V_B$ is the correct value with respect to the constant rate of normal sync pulses.

The invention as shown describes only one preferred embodiment. However, it is understood that a person skilled in the art could make various obvious modifications to the circuit which would be best suited for his particular application. For example, the deflection driving transistor may be a field effect transistor and a transformer can be inserted in series with the deflection coil to provide an additional correction signal to compensate for the IR loss (or any other loss) of the deflection circuit.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

I claim as my invention:

1. A protective circuit for use with a resonant type deflection circuit, including a voltage source for providing a controllable voltage, a deflection coil connected to the voltage source, a deflection transistor connected to one end of the deflection coil, and a deflection transistor driving circuit connected to the deflection transistor and having an input terminal for connection to a sync pulse generator for driving the transistor into a switched condition in response to a sync pulse received from the sync pulse generator, said protective circuit comprising:

current sensing means for connection in series with the deflection coil for sensing the magnitude of the current in the deflection coil and for developing a voltage representative of the sensed current;

compensating means for connection to the voltage source for compensating for variations in the turn-off delay time of the deflection transistor at different scanning rates of the sync pulses from the sync pulse generator and for developing a voltage in accordance therewith in response thereto; and comparator means connected to said current sensing means and to said compensating means for comparing the voltage developed by said current sensing means and the voltage developed by said compensating means and for developing an output signal in accordance with the comparison and, in use, for applying said output signal to the deflection transistor driving circuit for driving the deflection transistor into its switched condition when the output signal from said comparator means is received by the deflection transistor driving circuit before the sync pulse is received thereby;

whereby the deflection transistor is protected from an excessively large flyback voltage.

2. A protective circuit in accordance with claim 1, wherein said compensating means comprises an inverting amplifier for connection to the voltage source for converting the controllable voltage provided thereby into an attenuated and level shifted inverse of the controllable voltage, and said comparator means has one input terminal connected to receive said inverse of the controllable voltage and another input terminal connected to receive said voltage developed by said current sensing means.

3. A protective circuit in accordance with claim 2, wherein said inverting amplifier comprises:

a first resistor for connection on one side to the voltage source;

a second resistor connected to the other side of said first resistor and to a ground potential;

switching means having one terminal connected to said first and second resistors;

a third resistor connected to another terminal of said switching means and to a ground potential; and a fourth resistor connected to a further terminal of said switching means and for connection to a source of a predetermined voltage, the values of said first, second, third, and fourth resistors being selected so as to compensate for the variation in the turn-off delay time from one transistor to another functioning as the deflection transistor and for the variation in the turn-off delay time of the deflection transistor at different scanning rates of the sync pulse from the sync pulse generator.

4. A resonant type deflection circuit, comprising a voltage source for providing a controllable voltage, a deflection coil connected to the voltage source, a deflection transistor connected to one end of the deflection coil, an deflection transistor driving circuit connected to the deflection transistor and having an input terminal for connection to a sync pulse generator for driving the transistor into a switched condition in response to a sync pulse received from the sync pulse generator, and a protective circuit in accordance with claim 1.

* * * * *